United States Patent [19]

Shinonaga et al.

[11] Patent Number: 5,760,879
[45] Date of Patent: Jun. 2, 1998

[54] METHOD OF DETECTING COMA OF PROJECTION OPTICAL SYSTEM

[75] Inventors: Hirohiko Shinonaga, Utsunomiya; Izumi Tsukamoto, Tokyo; Hiroshi Morohoshi, Utsunomiya, all of Japan

[73] Assignee: Canon Kabushiki Kaisha, Tokyo, Japan

[21] Appl. No.: 498,483

[22] Filed: Jul. 5, 1995

[30] Foreign Application Priority Data

Jul. 6, 1994 [JP] Japan .................. 6-177558

[51] Int. Cl.$^6$ .................. G03B 27/42; G03B 27/52; G03B 27/32
[52] U.S. Cl. .................. 355/55; 355/53; 355/77; 356/399; 356/400; 356/401
[58] Field of Search .................. 355/53, 55, 77; 356/399, 400, 401; 250/559.3

[56] References Cited

U.S. PATENT DOCUMENTS

| | | | |
|---|---|---|---|
| 4,888,614 | 12/1989 | Suzuki et al. | 355/43 |
| 5,117,254 | 5/1992 | Kawashima et al. | 355/43 |
| 5,251,070 | 10/1993 | Hashimoto et al. | 359/732 |
| 5,289,312 | 2/1994 | Hashimoto et al. | 359/487 |
| 5,424,552 | 6/1995 | Tsuji et al. | 250/548 |
| 5,436,692 | 7/1995 | Noguchi | 355/53 |
| 5,615,006 | 3/1997 | Hirukawa et al. | 356/124 |

FOREIGN PATENT DOCUMENTS 6-117831  4/1994  Japan .

OTHER PUBLICATIONS

Kingslake, Rudolf. *Optical System Design*, Academic Press, NY, 1983.

Primary Examiner—R. L. Moses
Assistant Examiner—Shival Virmani
Attorney, Agent, or Firm—Fitzpatrick, Cella, Harper & Scinto

[57] ABSTRACT

A method of detecting coma of a projection optical system includes receiving an image of a pattern projected by the projection optical system, at at least one position along an optical axis of the projection optical system, detecting a position of at least one received pattern image, with respect to a plane perpendicular to the optical axis of the projection optical system, and determining coma of the projection optical system on the basis of the detection.

13 Claims, 13 Drawing Sheets

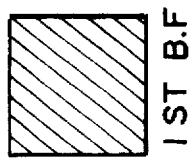 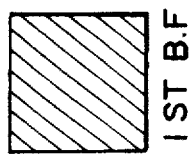 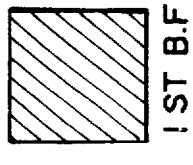 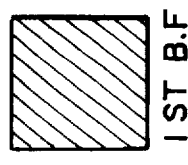 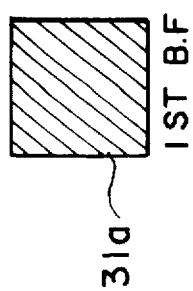
FIG. 4A
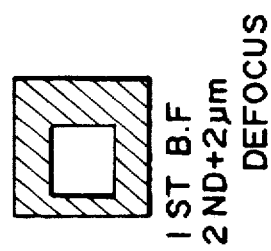 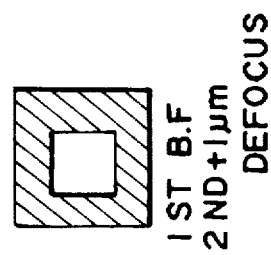 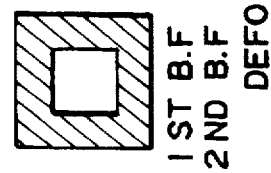 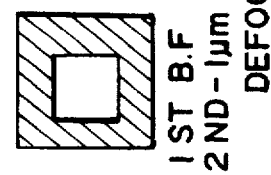 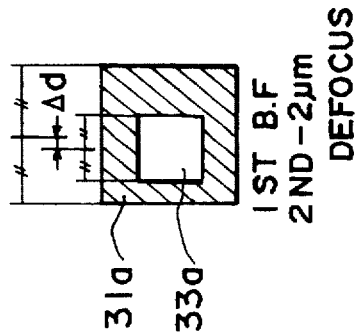
FIG. 4B

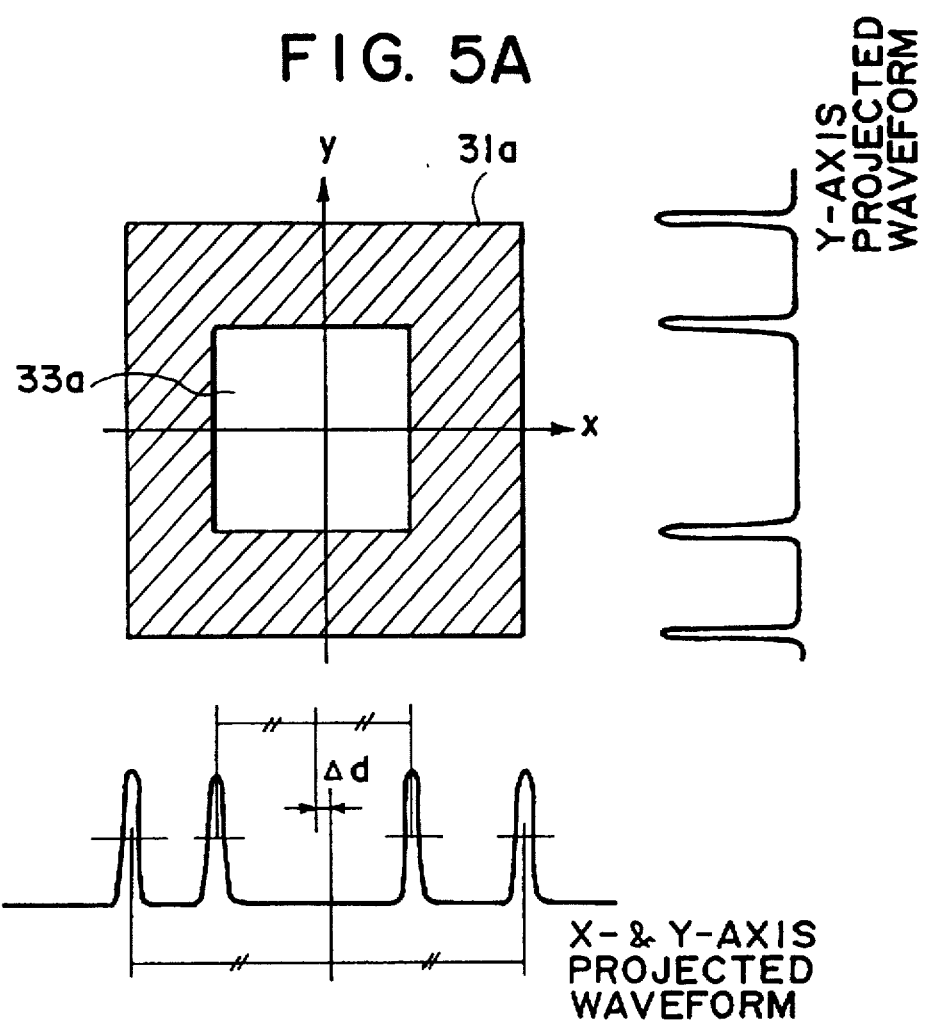

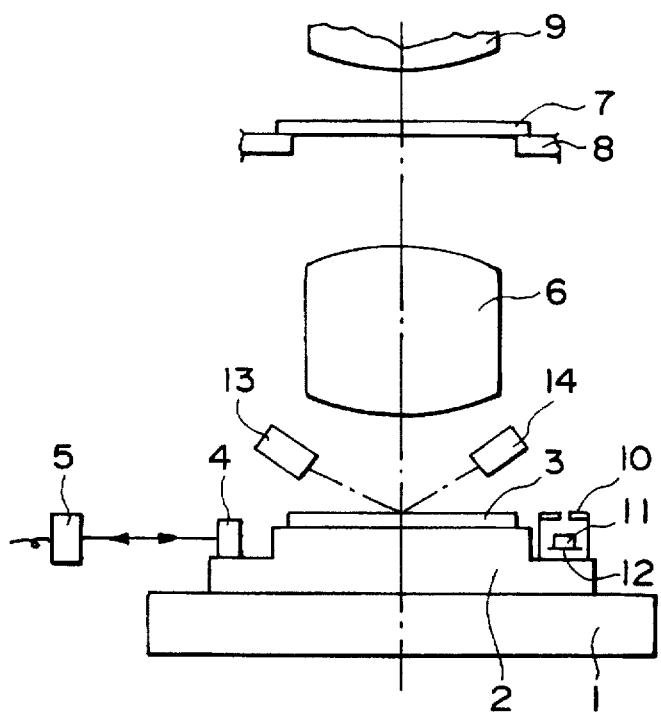
F I G. 6
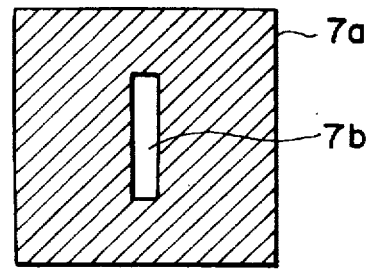
F I G. 7A
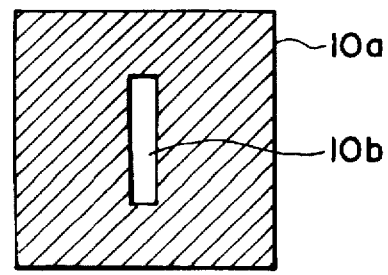
F I G. 7B

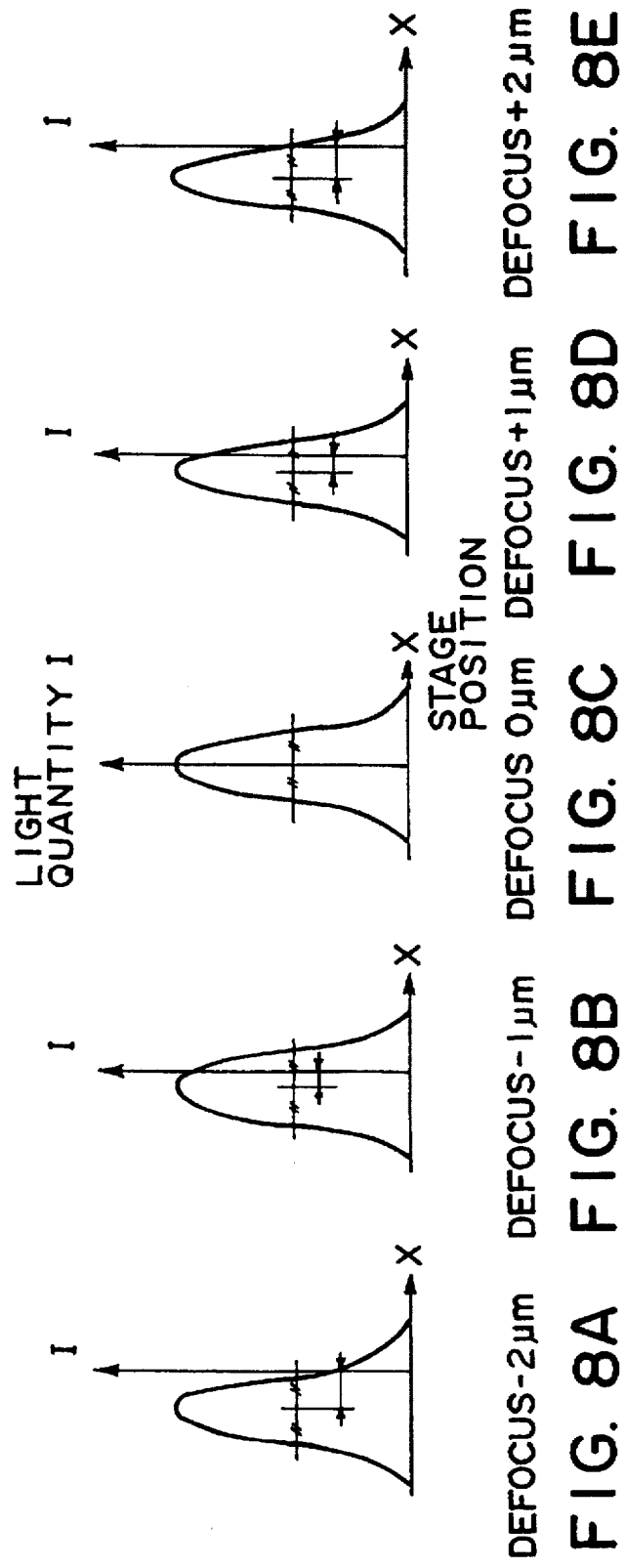

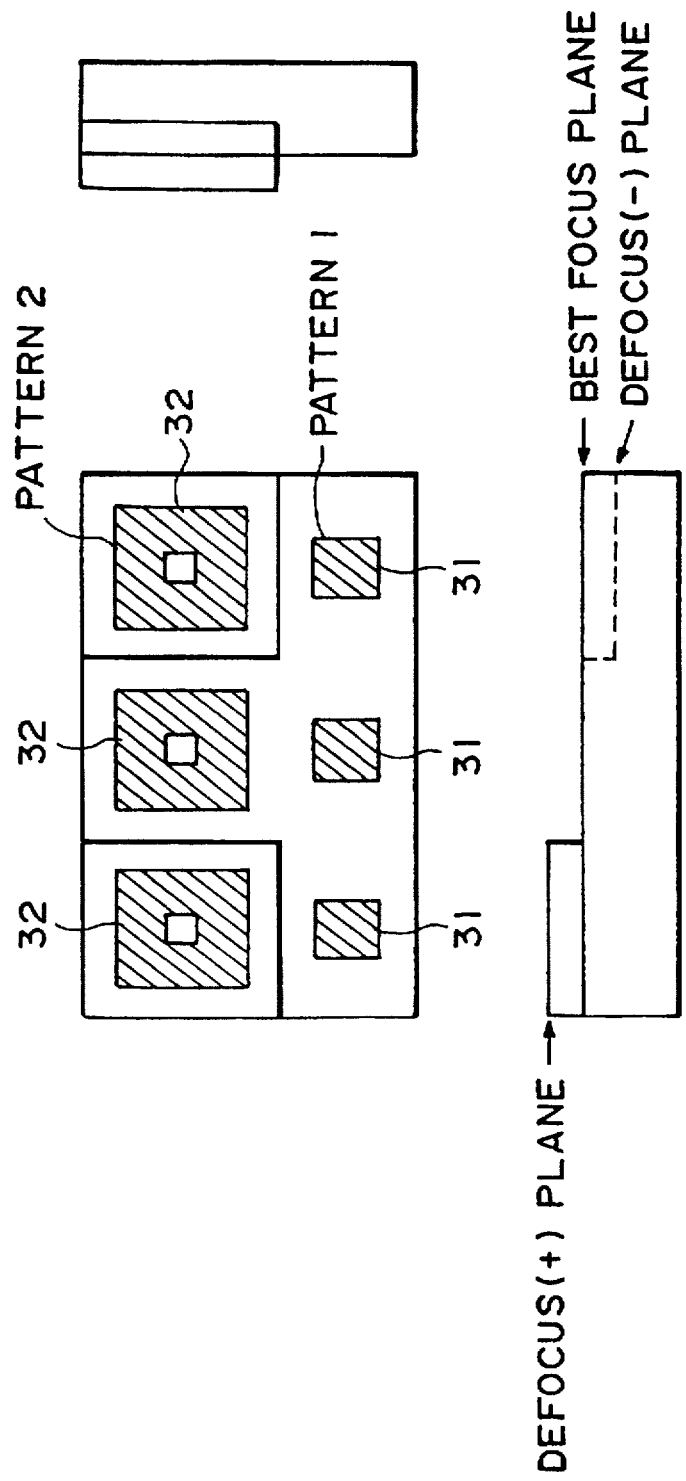

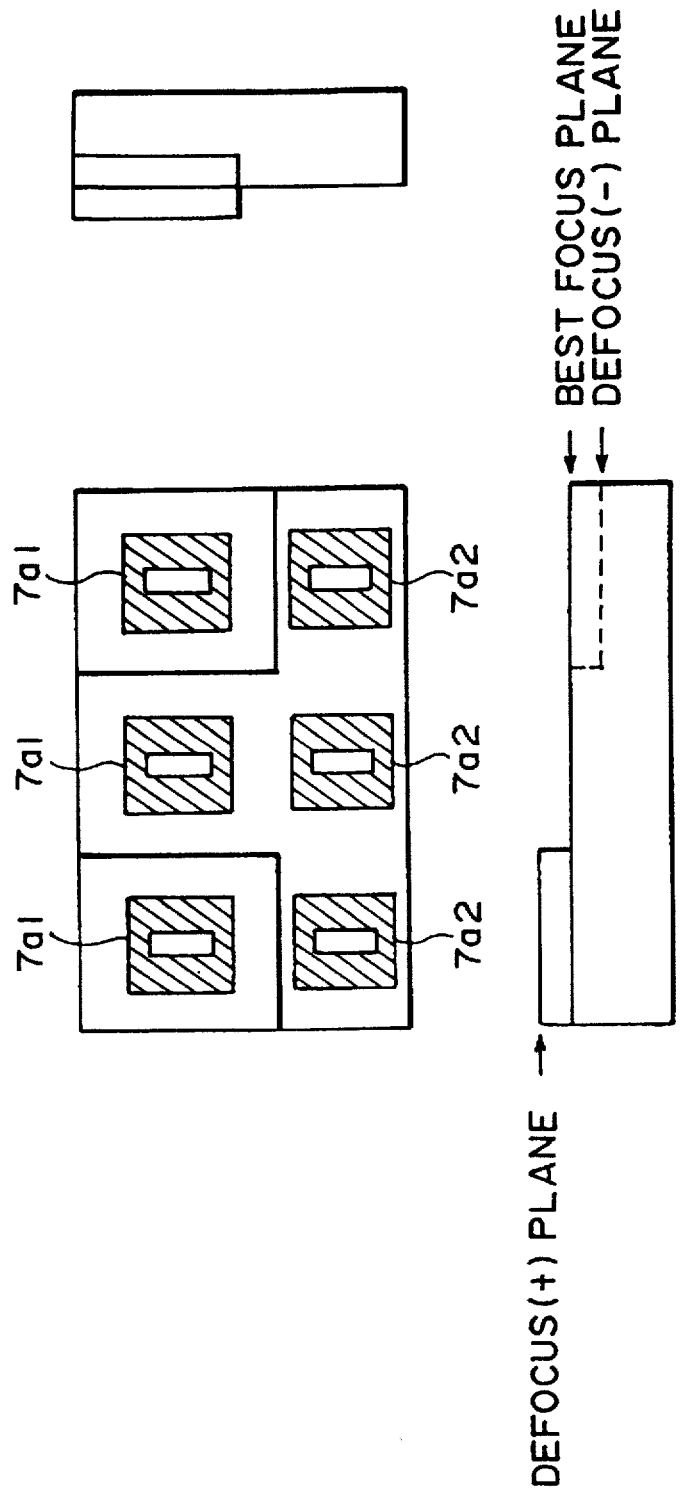

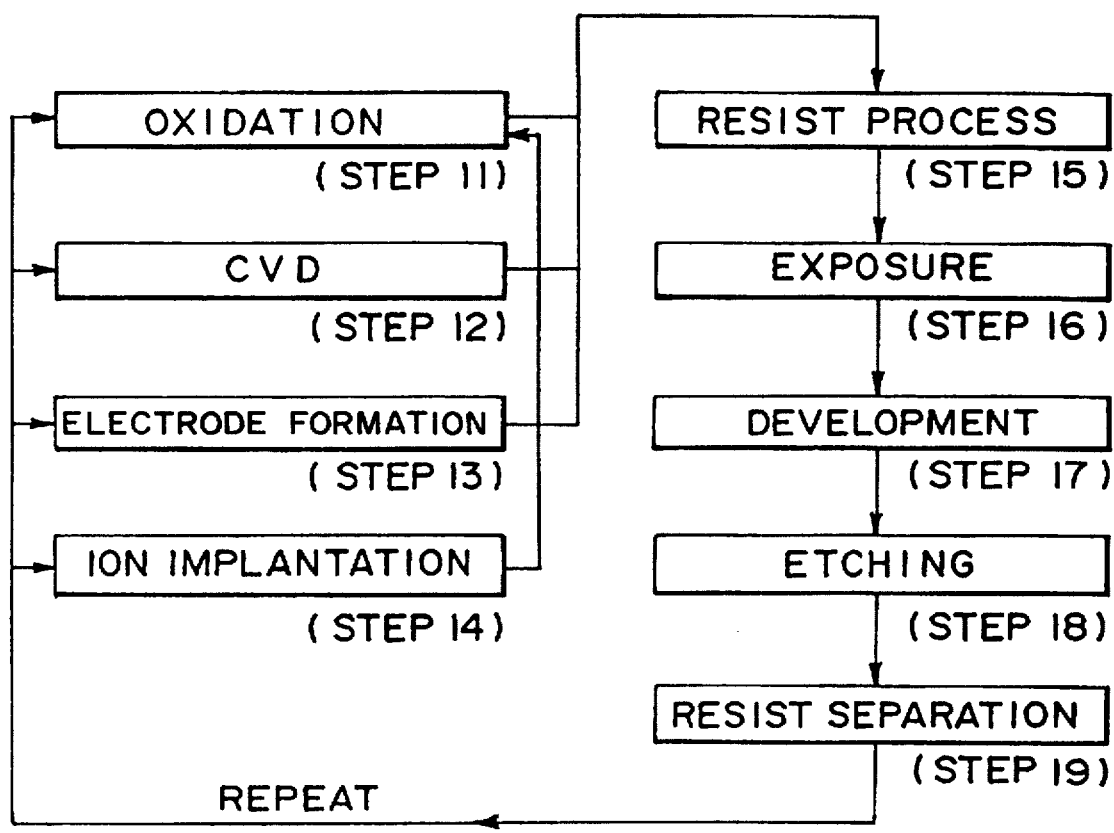
F I G. 14

METHOD OF DETECTING COMA OF PROJECTION OPTICAL SYSTEM

FIELD OF THE INVENTION AND RELATED ART

This invention relates to a method of detecting coma of a projection optical system. The invention is applicable, for example, to measurement of aberration of a projection optical system, particularly coma thereof, for projecting an electronic circuit pattern of a reticle onto a wafer in the manufacture of semiconductor devices such as ICs or LSIs, for example, in order to reduce the effect of such aberration and to ensure high resolution imaging of the circuit pattern upon the wafer.

For the manufacture of semiconductor devices such as ICs or LSIs, in many cases, a projection exposure apparatus (aligner) is used since it relatively easily attains high resolution and high throughput. In such a projection exposure apparatus, a wafer is moved every time one exposure process is completed and then another zone of the wafer is exposed. Such an exposure process is repeated sequentially so that images of an electronic circuit pattern are printed on the whole surface of the wafer. This is called a "step-and-repeat exposure method".

In this process, a projection optical system serves to project the electronic circuit pattern of a reticle onto the wafer surface in a reduced scale corresponding to a predetermined projection magnification such as 1:5 or 1:10, for example. Here, the image quality (projection resolution) of the image of the circuit pattern printed on the wafer is largely dependent upon the performance (aberration) of the projection optical system. One of the aberrations determining the performance of the projection optical system is coma. Proposals have been made in connection with how to measure coma of a projection optical system. Examples are as follows:

(a) A method wherein an interferometer is used to measure wavefront aberration to determine coma (wavefront aberration measurement method).

(b) A method wherein a pattern image is printed on a resist of a wafer and, after development, coma is determined on the basis of the shape of the printed pattern (resist pattern) (e.g. a difference in angle of walls of a projected image having a rectangular shape, for example) (printing method).

Such a wavefront aberration measurement method using an interferometer needs specific environmental conditions for the measurement, such as keeping constant environmental temperature or avoiding fluctuation of air, for example. Also, it needs a complicated measuring system and processing system. Thus, the measuring device as a whole is large.

Further, for the measurement, it is a requisition to place a lens system (projection optical system), to be examined, very precisely within the measuring device, and it takes a long working time. Additionally, a wavefront aberration measuring device itself is not widely used. Every user of a projection exposure apparatus may not possess such a measuring device, although every manufacturer of a projection exposure apparatus may have such a measuring device. It means a difficulty in performing the measurement in a factory in which the projection exposure apparatus is used.

On the other hand, in the printing method in which coma of a projection optical system is determined on the basis of the shape of a resist pattern, generally an SEM (scanning electron microscope: an example is the S62.90 (trade name) available from Kabushiki Kaisha Hitachi Seisakusho) is used to take a photograph of a section, and coma is determined from a difference in angle of the walls. However, this method needs a long measurement time and the precision is not good.

SUMMARY OF THE INVENTION

It is accordingly an object of the present invention to provide a coma detecting method by which coma of a projection optical system is detected very simply.

It is another object of the present invention to provide a coma correcting method by which coma of a projection optical system is corrected very simply.

It is a further object of the present invention to provide a projection exposure apparatus in which degradation of resolution due to coma is reduced significantly.

It is a yet further object of the present invention to provide a device manufacturing method in which degradation of resolution due to coma is reduced significantly.

In accordance with an aspect of the present invention, there is provided a method of detecting coma of a projection optical system, said method comprising the steps of: receiving an image of a pattern projected by the projection optical system, at at least one position along an optical axis of the projection optical system; detecting a position of at least one received pattern image, with respect to a plane perpendicular to the optical axis of the projection optical system; and determining coma of the projection optical system on the basis of said detection.

In one preferred form of this aspect of the present invention, a single pattern formed on a reticle is projected by the projection optical system, and images of the single pattern are received sequentially at different positions along the optical axis of the projection optical system.

In accordance with another aspect of the present invention, there is provided a method of detecting coma of a projection optical system, said method comprising the steps of: providing patterns at different positions along an optical axis of the projection optical system; receiving images of the patterns projected by the projection optical system; detecting positions of the received pattern images with respect to a plane perpendicular to the optical axis of the projection optical system; and determining coma of the projection optical system on the basis of said detection.

In one preferred form of this aspect of the present invention, the patterns are formed at upper and lower levels defined at the surface of a reticle, and wherein images of the patterns as projected by the projection optical system are received.

In one preferred form of the first or second aspect of the present invention, a reference pattern defined on the or a reticle is projected by the projection optical system, wherein an image of the reference pattern is received and recorded at different positions on an image plane of the projection optical system and on the substrate, wherein the pattern images are received and recorded at positions on the substrate adjacent to the reference pattern image receiving position, and wherein the position of each pattern image with respect to the position of a corresponding reference pattern image is detected.

In accordance with one preferred form of the first or second aspect of the present invention, a reference pattern defined on the or a reticle is projected by the projection optical system, wherein an image of the reference pattern is received upon an image plane of the projection optical system and by the photoelectrically converting means, wherein the position of the received image is memorized, wherein the pattern images are received by the photoelectrically converting means and at positions adjacent to the reference pattern image receiving position, wherein the positions of the received pattern images are memorized, and wherein the position of each pattern image with respect to the position of a corresponding reference pattern image is detected.

In accordance with a further aspect of the present invention, there is provided a method of correcting coma of a projection optical system, said method comprising the steps of: detecting coma of the projection optical system in accordance with any one of the methods described above; and tilting at least one of lenses of the projection optical system with respect to an optical axis of the projection optical system, so as to reduce the coma.

In accordance with a yet further aspect of the present invention, there is provided a method of correcting coma of a projection optical system, said method comprising the steps of: detecting coma of the projection optical system in accordance with any one of the methods described above; and shifting an optical axis of at least one of the lenses of the projection optical system, off an optical axis of the projection optical system, so as to reduce the coma.

In accordance with a yet further aspect of the present invention, there is provided a method of correcting coma of a projection optical system, said method comprising the steps of: detecting coma of the projection optical system in accordance with any one of the methods described above; and tilting a parallel flat plate, disposed on a light path of the projection optical system, so as to reduce the coma.

The coma correcting methods described above may be used in any combination.

In one preferred form of these aspects of the present invention, the parallel flat plate comprises a sheet glass provided to seal at least one element of the projection optical system.

In one preferred form of these aspects of the present invention, the parallel flat plate is disposed at an image side of the projection optical system.

In one preferred form of these aspects of the present invention, the parallel flat plate is disposed at an object side of the projection optical system.

In accordance with a further aspect of the present invention, there is provided a projection exposure apparatus, characterized in that: a pattern of a mask is projected on a substrate through a projection optical system, wherein coma of the projection optical system is corrected in accordance with any one of the coma correcting methods described above.

In accordance with a yet further aspect of the present invention, there is provided a projection exposure apparatus for projecting a pattern of a mask onto a substrate through a projection optical system, characterized by: coma changing means for changing coma of the projection optical system so as to reduce the same; and detecting means for detecting coma of the projection optical system.

In one preferred form of this aspect of the present invention, said coma changing means includes at least one of a lens element and a parallel flat plate, wherein said lens element is adapted to be tilted and/or translated, and wherein said parallel flat plate is adapted to be tilted.

In accordance with a still further aspect of the present invention, there is provided a projection exposure apparatus for projecting a pattern of a mask onto a substrate through a projection optical system, characterized by inclusion of detecting means for detecting coma of the projection optical system.

In accordance with a yet further aspect of the present invention, there is provided a device manufacturing method for printing a device pattern on a workpiece by use of any one of the projection exposure apparatuses described above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A and 4B are schematic views, respectively, for explaining the amount of shift of a projected image of a reticle mark, corresponding to the amount of defocus, obtainable with the apparatus of FIG. 1.

FIGS. 5A and 5B are schematic views for explaining the amount of image shift of a projected image of a reticle mark of FIG. 1.

FIG. 6 is a schematic view of a main portion of a projection exposure apparatus in which a second embodiment of a coma detecting method of the present invention for detecting coma of a projection optical system is incorporated.

FIGS. 7A and 7B are enlarged views, respectively, for explaining a portion of FIG. 6.

FIGS. 8A through 8E are schematic views for explaining the amount of shift of a projected image of a reticle mark, corresponding to the amount of defocus, obtainable with the apparatus of FIG. 6.

FIGS. 9A1, 9A2, 9B1 and 9B2 are schematic views, respectively, for explaining a reticle mark usable in a third embodiment of a coma detecting method of the present invention, for detecting coma of a projection optical system.

FIG. 14 is a flow chart of a wafer process included in the flow chart of FIG. 13.

DESCRIPTION OF THE PREFERRED EMBODIMENTS

In a first embodiment of the present invention, briefly, a pattern for detection of coma formed on a reticle is projected by a projection optical system on a resist, applied to a wafer, in a reduced scale. Here, pattern images (resist patterns) are formed at different positions along the focusing direction of the projection optical system (i.e., along the optical axis of the projection optical system), and the position of each resist pattern in a plane perpendicular to the optical axis is measured. Then, from the positional information of the resist patterns, coma of the projection optical system is detected.

Initially, a description will be made of the relationship between the amount of shift of a pattern image and the amount of coma, which relation should be predetected for detection of coma from the positional information of resist patterns at different positions with respect to the focusing direction of the projection optical system.

Figure 2:
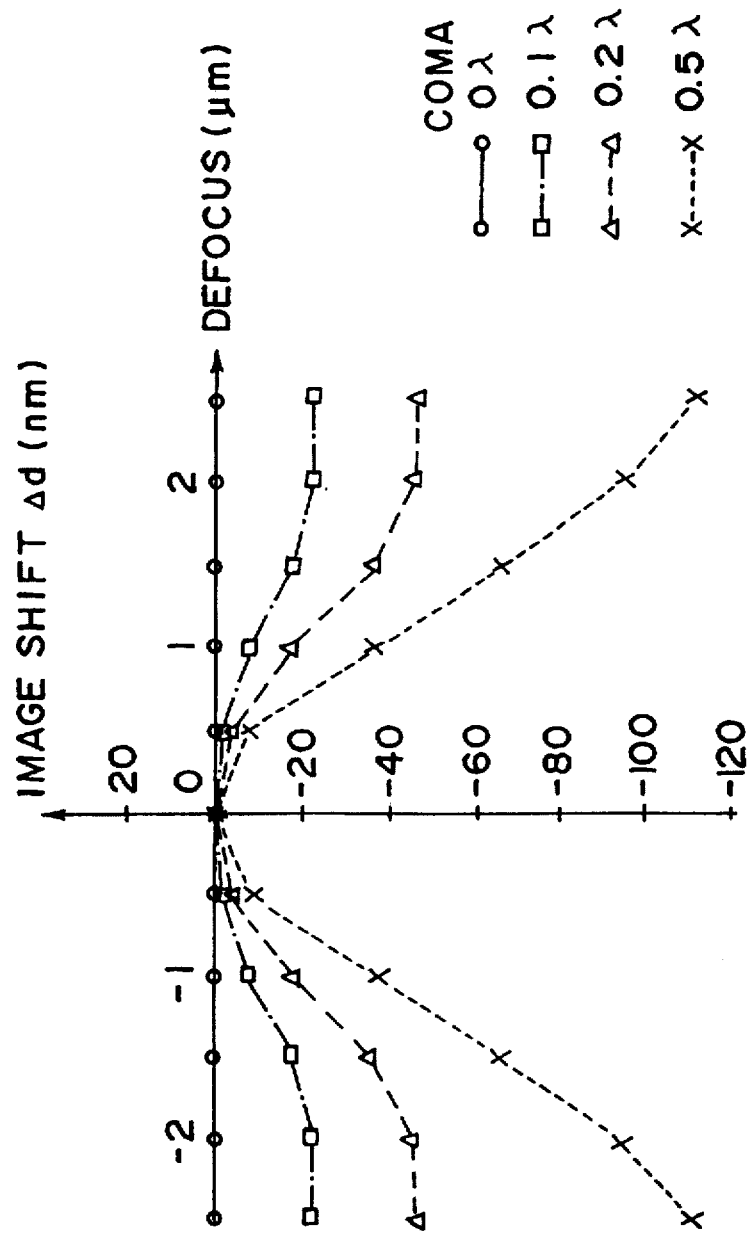
FIG. 2 is a graph for explaining the principle of detection for detecting coma of a projection optical system.

FIG. 2 illustrates how the amount of image shift as represented by $\Delta d$ (nm) (which bears positional information of the resist pattern) changes with the amount of coma, when the position of the wafer surface with respect to the image plane (imaging position) of a projection optical system (N.A.=0.52) is changed along the focusing direction sequentially.

The drawing of FIG. 2 shows the results of a simulation made with respect to four cases of coma 0, 0.1$\lambda$, 0.2 $\lambda$ and 0.5 $\lambda$ ($\lambda$ is the wavelength of exposure light).

In this embodiment, a simulation such as illustrated in FIG. 2 is performed beforehand with respect to many cases of coma, and a graph is prepared. Then, a curve of a image shift amount $\Delta d$ of a resist pattern where the wafer surface position is changed sequentially along the focusing direction, is determined. From the relation between the thus obtained curve and the graph of FIG. 2, the amount of coma of the projection optical system is detected.

Figure 1:
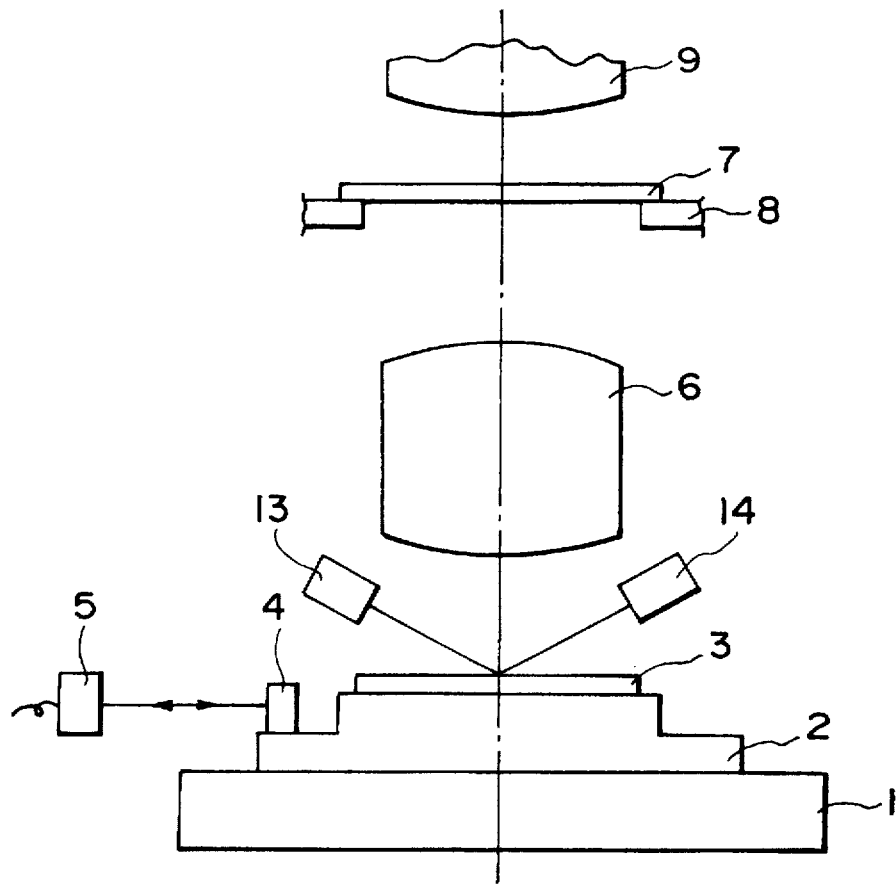
FIG. 1 is a schematic view of a main portion of a projection exposure apparatus in which a first embodiment of a coma detecting method of the present invention, for detecting coma of a projection optical system, is incorporated.

FIG. 1 is schematic view of a first embodiment of the present invention, wherein the method of the present invention for detecting coma of a projection optical system is applied to a semiconductor device manufacturing projection exposure apparatus.

In this embodiment, the amount of coma of a projection optical system 6 of the projection exposure apparatus in FIG. 1 is detected on the basis of the graph of FIG. 2.

Now, components of the FIG. 1 apparatus will be explained. In FIG. 1, light emitted from an illumination system 9 irradiates a reticle 7 (first object) which is placed on a reticle stage 8. The projection optical system 6 projects an electronic circuit pattern formed on the reticle 7 onto a wafer 3 (second object). The surface of the wafer 3 is coated with a resist (photosensitive material), and the wafer is held fixed on a movable stage (X-Y-Z stage) 2 which is mounted on a base 1. By means of a driving system (not shown), the movable stage 2 can be moved in X and Y directions as well as in a Z direction (along the optical axis of the projection optical system 6). The amount of movement of the movable stage in the X, Y and Z directions is monitored through X-axis and Y-axis mirrors 4 and laser distance measuring devices 5 as well as a level measuring means. In FIG. 1, only the laser distance measuring device 5 for the X-axis movement measurement is illustrated, and the laser distance measuring device for the Y-axis movement measurement is not shown.

The optical axis of the laser distance measuring devices 5 is set at the same level as the wafer 3 surface, for avoiding Abbe's error. Denoted at 13 is light projecting means for projecting light onto the wafer 3 surface. Denoted at 14 is light receiving means for detecting incidence position information of reflected light from the wafer 3 surface. The light projecting means 13 and the light receiving means 14 are constituent elements of level measuring means for measuring the level (height) of the wafer 3 surface.

For manufacture of semiconductor devices, the reticle 7 and the wafer 3 are positioned in a predetermined interrelationship and, thereafter, shutter means (not shown) is opened and closed such that the electronic circuit pattern on the reticle 7 surface is projected and printed on the wafer 3 surface. Subsequently, by means of the wafer stage 2, the wafer 3 is moved by a predetermined amount along the X-Y plane such that the reticle 7 and the wafer 3 are positioned again. In this manner, the remaining zones (shot areas) of the wafer are exposed sequentially through projection exposure (step-and-repeat exposure process). After completion of exposures of all the zones of the wafer 3 surface, the wafer is processed by a developing treatment and so on which are known per se, and semiconductor devices are manufactured.

How to measure coma of the projection optical system 6 of the projection exposure apparatus of FIG. 1, will be explained below.

Figures 3A, 3B:
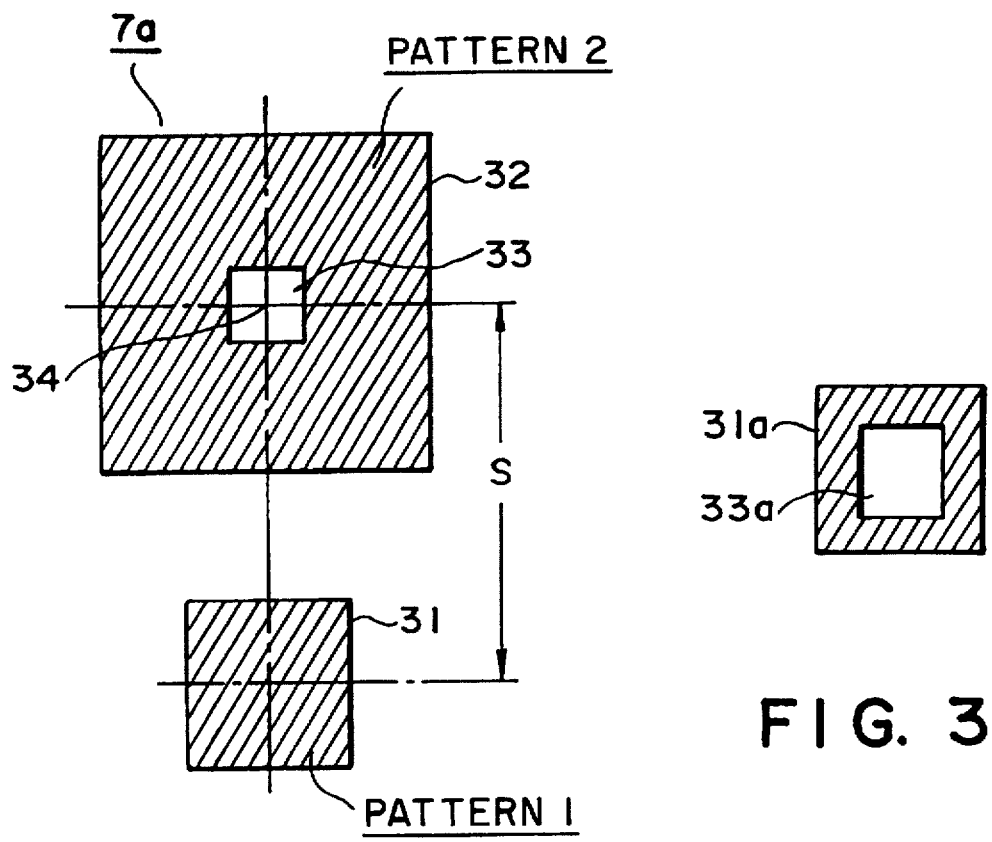
FIGS. 3A and 3B are schematic views, respectively, of a reticle mark of FIG. 1 and a projected image thereof.

FIG. 3A illustrates a reticle mark 7a formed on a reticle 7, which mark comprises a pattern 1 (reference pattern) and a pattern 2. Areas with hatching depict light blocking areas. FIG. 3B shows a pattern image (resist pattern) of the reticle mark 7a, as formed on the wafer 3 surface through the projection optical system 6. The area with hatching depicts the resist pattern. For convenience, in FIG. 3B, only an image 31a of the outside periphery 31 of the pattern 1 of FIG. 3A and an image 33a of the inside periphery 33 of the pattern 2 of FIG. 3A are illustrated.

In the present embodiment, first, the reticle pattern 7a shown in FIG. 3A is illuminated, and it is printed by projection exposure onto the resist coating of the wafer 3 (this is called "first printing"). At this moment, the surface of the resist of the wafer 3 is placed and held at the best image plane position of the projection optical system 6. Also, the movable stage 2 is moved stepwise along the X-Y plane, such that plural reticle patterns 7a are printed on the wafer through the "first printing".

FIG. 4A shows resist patterns on a wafer formed through a developing process after the first printing. The resist patterns of FIG. 4A are those of the pattern 1 (reference pattern) only, of the patterns shown in FIG. 3A. Reference characters "B.F" in FIG. 4A (and in FIG. 4B) represent "best focus".

Subsequently, the reticle pattern 7a is printed by projection exposure on the wafer 3 again (this is called "second printing") while shifting the stage 2 by an amount corresponding to a distance S relative to the first printing, so that the center 34 of the pattern 2, of the patterns shown in FIG. 3A, is aligned with the resist pattern 31a (of the pattern 1) having been formed on the wafer 3. The second printing operation is performed while moving the Z stage to shift the wafer in the focusing direction through some steps, from the best imaging plane (defocus=0).

FIG. 4B illustrates reticle patterns 7a as formed on the wafer 3 as a result of the first printing followed by a developing process and the second printing followed by a developing process, while sequentially changing the position in the focusing direction.

Subsequently, a deviation $\Delta d$ (image shift amount) between the center position as detected from the outside edge (outside periphery) 31a having been printed through the first printing and the center position as detected from the inside edge (inside periphery) 33a having been printed through the second printing, is measured. Such positional information of the resist patterns 31a and 33a is obtainable by using a commercially available registration measuring device such as KLA-5011 (trade name) available from KLA Co., LA-3000 (trade name) available from Hitachi Denshi Engineering Co., on METRA2100 (trade name) available from OSI Co.

In this embodiment, from deviations Δd detected in this manner, a graph similar to that of FIG. 2 is prepared. From the thus prepared graph, those results corresponding to the coma of the projection optical system 6 are provided. On the basis of those results as well as the graph of FIG. 2, the amount of coma of the projection optical system 6 is discriminated (measured).

FIGS. 5A and 5B show projection waveforms as detected by a registration measuring device in relation to the resist patterns 31a and 33a in this embodiment, as well as how the centers of the pattern images (outside 31a and inside 33a) are detected from the projection waveforms. In this example, a projection waveform is sliced with respect to a certain intensity, and the center of each pattern image is determined on the basis of the position of a mid-point of the sliced waveform.

In the present invention, the measurement may be based on any other measurement process such as, for example, a template matching method wherein matching is performed with respect to a predetermined waveform, or a method wherein symmetry is measured for evaluation. Also, the results of measurements made in the X and Y directions may be integrated (vector combination) and, on that occasion, the direction and magnitude of coma can be discriminated.

FIG. 6 is a schematic view of a main portion of a second embodiment of the present invention, wherein the coma detecting method of the present invention for detecting coma of a projection optical system is incorporated into a semiconductor device manufacturing projection exposure apparatus. This embodiment has features, as compared with the first embodiment of FIG. 1, that a slit 10 and a photoelectric sensor 11 are mounted on the stage 2, that a reticle mark (single pattern) 7a constituting a slit opening 7b such as illustrated in FIG. 7A is formed on the reticle 7 (here, components are so set that the slit opening 7b of the reticle mark 7a is to be projected by the projection optical system 6 in the same size as that of the slit opening 10b of the slit 10), and that the reticle mark 7a is projected by the projection optical system 6 upon the slit 10 surface. The remaining portion of this embodiment has substantially the same structure as that of the first embodiment.

In this embodiment, the position of the stage 2 in the Z direction is so set that the position of the slit 10 in the focusing direction is placed at the best image plane position. Subsequently, the X-Y stage is moved so that the slit 10 moves across the projected image of the reticle mark of the reticle 7.

After this, the stage 2 is moved in the Z direction and, while sequentially changing the position of the slit 10 in the focusing direction from the best image plane position, the stage scan is repeated sequentially.

FIGS. 8A through 8E illustrate signals obtained through the photoelectric sensor 11 in relation to pattern images of the reticle mark 7a. The illustrated case is the relationship between the position of the X-Y stage and the light quantity as detectable at the photoelectric sensor 11, in cases wherein the amount of defocus in the focusing direction is changed sequentially. From the values Δd of the amount of image shift relative to the amount of defocus, thus obtained, the amount of coma of the projection optical system is determined essentially in the same manner as in the first embodiment.

FIGS. 9A1 through 9B2 are schematic views, respectively, each showing a pattern on a reticle and each for explaining a third embodiment of the present invention for detecting coma of a projection optical system.

In the example of FIGS. 9A1 and 9A2, reticle patterns each being similar to the reticle pattern 7a of FIG. 3A are formed and juxtaposed on the surface of a reticle. Upper patterns correspond to the pattern 1 of FIG. 3A, and lower patterns correspond to the pattern 2 of FIG. 3A. Of these patterns, particular patterns are defined with steps (level differences). Namely, these particular patterns are at defocused positions. With the provision of such defocused reticle patterns (patterns 2), similar pattern images as those of FIGS. 4A and 4B are obtained without moving the stage 2 in the focusing direction as in the first embodiment of FIG. 1. The manner of measuring coma of the projection optical system is substantially the same as that of the first embodiment.

In the example of FIGS. 9B1 and 9B2, reticle patterns each being similar to the reticle pattern 7a of FIG. 7A are formed and juxtaposed on the surface of a reticle. Lower reticle patterns $7a_2$ of FIGS. 9B1 and 9B2 correspond to the reference pattern. Upper reticle patterns $7a_1$ are formed with steps (level differences). Thus, the patterns $7a_1$ are at defocused positions. With the provision of such defocused reticle patterns $7a_1$, signals related to pattern images similar to those of FIGS. 8A through 8E are obtained without moving the stage 2 in the focusing direction as in the second embodiment of FIG. 6. The manner of measuring coma of the projection optical system is substantially the same as that of the first embodiment.

Figure 10:
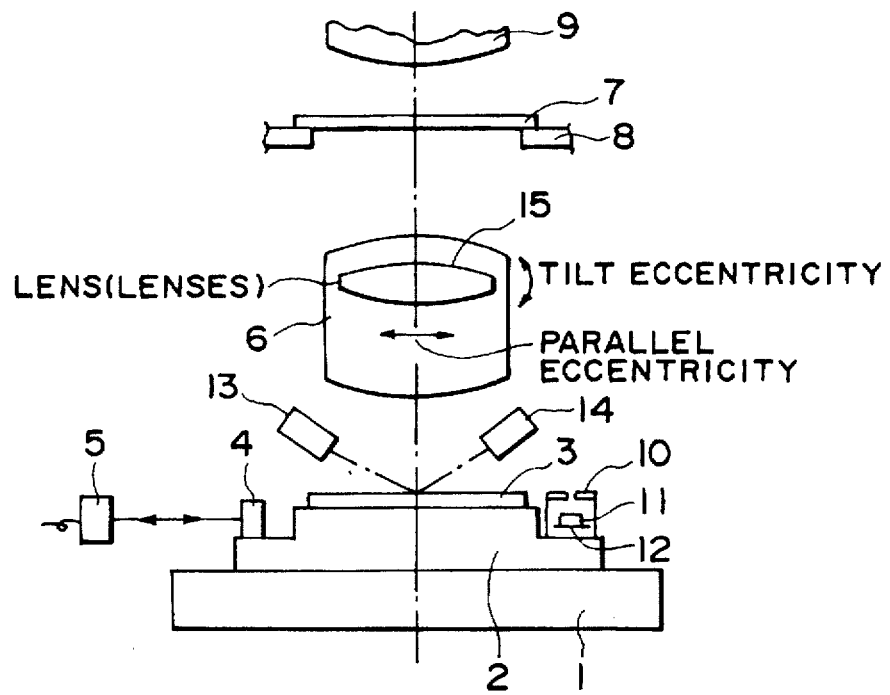
FIG. 10 is a schematic view of a projection exposure apparatus according to an embodiment of the present invention, which is provided with means for correcting coma of a projection optical system.
Figure 11:
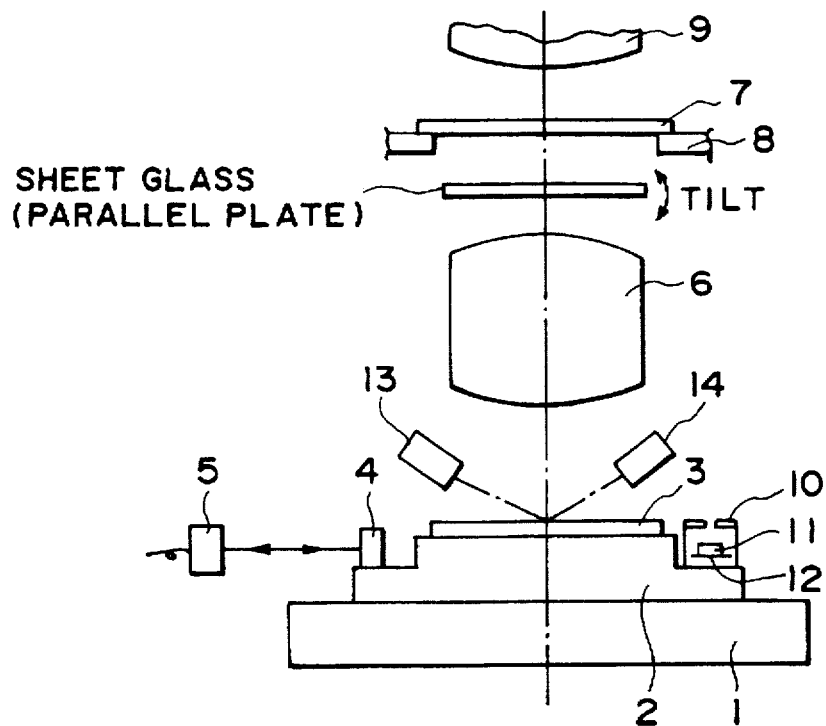
FIG. 11 is a schematic view of a projection exposure apparatus according to another embodiment of the present invention, which is provided with means for correcting coma of a projection optical system.
Figure 12:
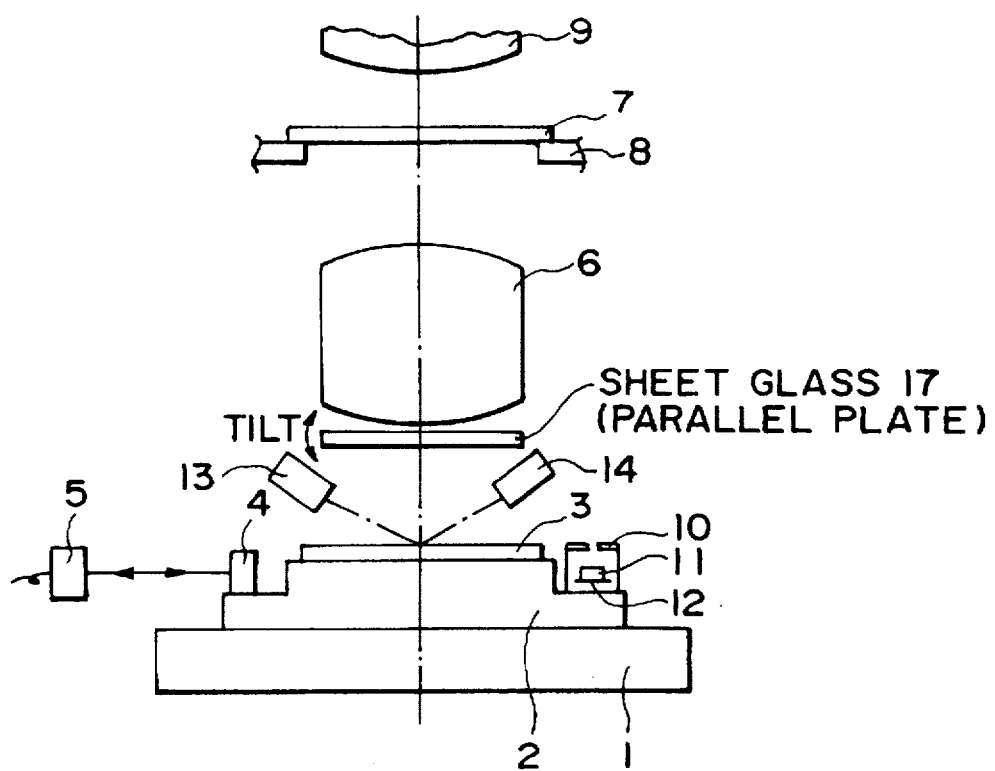
FIG. 12 is a schematic view of a projection exposure apparatus according to a further embodiment of the present invention, which is provided with means for correcting coma of a projection optical system.

FIGS. 10–12 are schematic views of embodiments of the present invention, wherein the invention is applied to a projection exposure apparatus which is provided with means for measuring coma of a projection optical system and means for correcting coma. Like numerals as those of FIG. 6 are assigned to corresponding elements.

FIG. 10 shows an embodiment wherein one or more of the lens elements of the projection optical system is able to be tilted with respect to or translated off the optical axis of the projection optical system, for correcting coma.

FIG. 11 shows an embodiment wherein a parallel flat plate 16 is provided between the projection optical system 6 and the reticle 7 (object plane), which parallel flat plate is able to be tilted with respect to the optical axis of the projection optical system, for correcting coma.

FIG. 12 shows an embodiment wherein a parallel flat plate 17 is provided between the projection optical system 6 and the wafer 3 (image plane), which parallel flat plate is able to be tilted with respect to the optical axis of the projection optical system, for correcting coma.

In the embodiments of FIGS. 10–12, the relation between the amount of coma of the projection optical system and the amount of tilt or translation to or off the optical axis is determined beforehand on the basis of simulations or experiments. In accordance with the magnitude and direction of coma of the projection optical system as can be determined with the coma measuring method having been described, correction of coma is performed. It is to be noted that the embodiments of FIGS. 10–12 may be arranged to perform coma measurement in accordance with the method described with reference to the first embodiment.

The embodiments described above may be modified. Examples are: the object plane and the image plane may be reversed (the state of defocus at the wafer side is replaced by a similar state at the reticle side); the first best focus and the second defocus in the first embodiment may be replaced by first defocus and second best focus; in the second and third embodiments, the measurement may be made with respect to both of the X and Y directions to specify the direction and magnitude of coma of the projection lens system; the measurement mark (reticle mark) may be provided by a number of marks for enhancement of measurement precision; in place of receiving pattern images for detection of coma at different defocused positions, the amount of coma may be determined by receiving the image at a single defocused position and by using the graph of FIG. 2.

Next, an embodiment of a device manufacturing method according to the present invention which uses one of the projection exposure apparatuses described above, will be explained.

Figure 13:
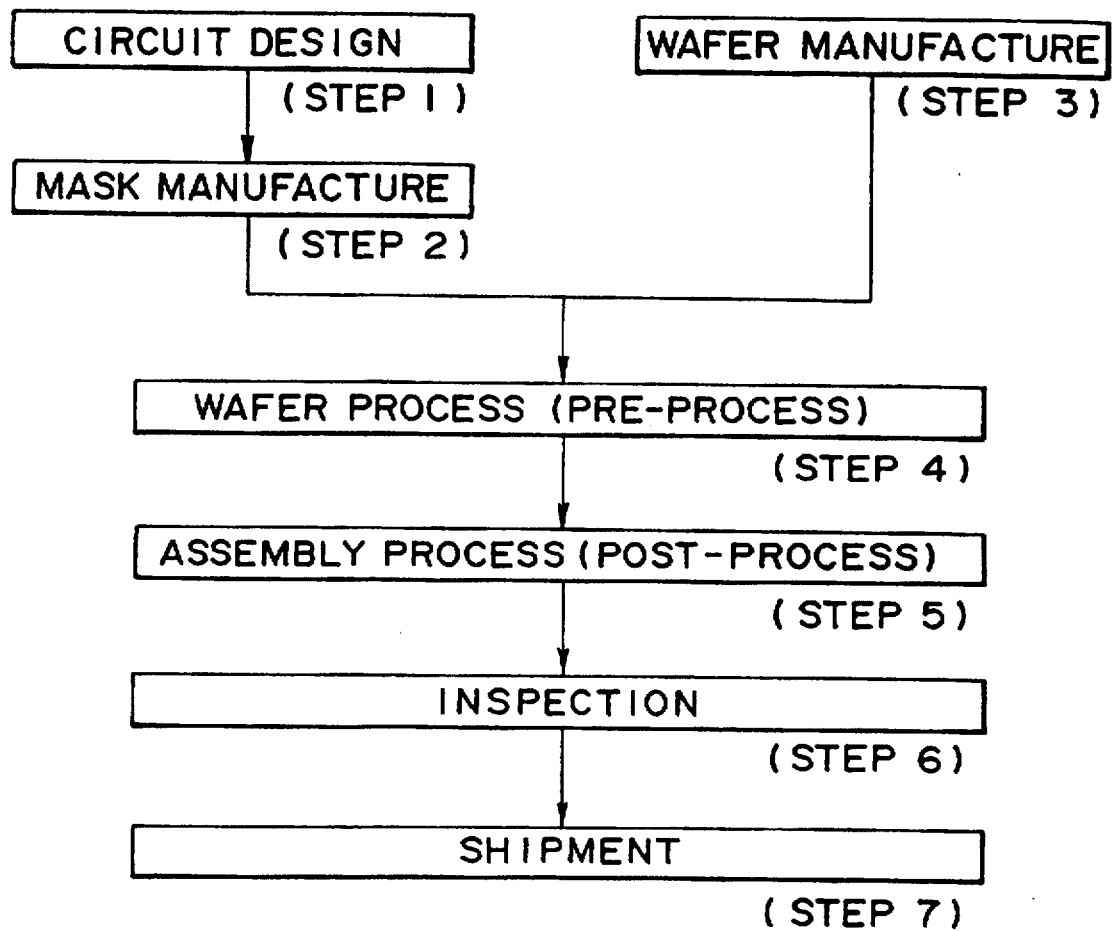
FIG. 13 is a flow chart of semiconductor device manufacturing processes according to the present invention.

FIG. 13 is a flow chart of the sequence of manufacturing a semiconductor device such as a semiconductor chip (e.g., an IC or an LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, durability check a and so on of the semiconductor devices produced by step 5 are carried out. With these processes, semiconductor devices are finished and they are shipped (step 7).

FIG. 14 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting coma of a projection optical system, said method comprising the steps of:

providing patterns at different positions along an optical axis of the projection optical system, wherein the patterns are formed at upper and lower levels defined at the surface of a reticle;

receiving images of the patterns as projected by the projection optical system;

detecting positions of the received pattern images with respect to a plane perpendicular to the optical axis of the projection optical system; and determining coma of the projection optical system on the basis of the detection in said detecting step.

2. A method according to claim 1, wherein pattern images are received and recorded at different positions on a resist-coated substrate, and the positions of the recorded pattern images are detected.

3. A method according to claim 2, wherein a reference pattern defined on the reticle, or on a reticle, is projected by the projection optical system, an image of the reference pattern is received and recorded at different positions on an image plane of the projection optical system and on the substrate, the pattern images are received and recorded at positions on the substrate adjacent to the reference pattern image receiving position, and the position of each pattern image with respect to the position of a corresponding reference pattern image is detected.

4. A method according to claim 1, wherein each pattern image is received by a photoelectrical converting means.

5. A method according to claim 4, wherein a reference pattern defined on the reticle, or on a reticle, is projected by the projection optical system, an image of the reference pattern is received upon an image plane of the projection optical system and by the photoelectrical converting means, the position of the received image is memorized, the pattern images are received by the photoelectrical converting means and at positions adjacent to the reference pattern image receiving position, the positions of the received pattern images are memorized, and the position of each pattern image with respect to the position of a corresponding reference pattern image is detected.

6. A method of correcting coma of a projection optical system, said method comprising the steps of:

detecting coma of the projection optical system in accordance with the method as recited in claim 1; and tilting at least one lens of the projection optical system with respect to an optical axis of the projection optical system, so as to reduce the coma.

7. A method of correcting coma of a projection optical system, said method comprising the steps of:

detecting coma of the projection optical system in accordance with the method as recited in claim 1; and shifting an optical axis of at least one lens of the projection optical system, off an optical axis of the projection optical system, so as to reduce the coma.

8. A method of correcting coma of a projection optical system, said method comprising the steps of:

detecting coma of the projection optical system in accordance with the method as recited in claim 1; and tilting a parallel flat plate, disposed on a light path of the projection optical system, so as to reduce the coma.

9. A method according to claim 8, wherein the parallel flat plate comprises a glass sheet provided to seal at least one element of the projection optical system.

10. A method according to claim 8, wherein the parallel flat plate is disposed at an image side of the projection optical system.

11. A method according to claim 8, wherein the parallel flat plate is disposed at an object side of the projection optical system.

12. A projection exposure method, comprising:

projecting a pattern of a mask onto a substrate through a projection optical system; and correcting coma of the projection optical system in accordance with the method recited in claim 3.

13. A device manufacturing method, comprising:

printing a device upon a workpiece through a projection optical system; and correcting coma of the projection optical system in accordance with the method recited in claim 3.

* * * * *

UNITED STATES PATENT AND TRADEMARK OFFICE
CERTIFICATE OF CORRECTION

PATENT NO. : 5,760,879

DATED : June 2, 1998

INVENTORS : HIROHIKO SHINONAGA, ET AL.

It is certified that error appears in the above-identified patent and that said Letters Patent is hereby corrected as shown below:

COLUMN 2:

line 30, "in" should read --In--.

COLUMN 5:

line 27, "a image" should read --an image--.

COLUMN 7:

line 4, "on" should read --or--.

COLUMN 9:

line 26, "durability check a" should read --a durability check--.

Signed and Sealed this

Second Day of March, 1999

*Attest:*

Q. TODD DICKINSON

*Attesting Officer*    *Acting Commissioner of Patents and Trademarks*